United States Patent [19]

Schmitt-Landsiedel et al.

[11] Patent Number: 4,680,481
[45] Date of Patent: Jul. 14, 1987

[54] INTEGRATED JK-FLIPFLOP CIRCUIT INCLUDING HOT-ELECTRON TRANSISTORS

[75] Inventors: Doris Schmitt-Landsiedel; Gerhard Dorda, both of Munich, Fed. Rep. of Germany

[73] Assignee: Siemens Aktiengesellschaft, Berlin and Munich, Fed. Rep. of Germany

[21] Appl. No.: 636,922

[22] Filed: Aug. 2, 1984

[30] Foreign Application Priority Data

Aug. 19, 1983 [DE] Fed. Rep. of Germany ....... 3330079

[51] Int. Cl.⁴ .......................................... H03K 3/356
[52] U.S. Cl. .................................. 307/279; 307/291; 307/450; 307/304; 357/43
[58] Field of Search ................... 307/279, 291, 299 R, 307/303, 570, 450, 304; 357/4, 6, 43

[56] References Cited

U.S. PATENT DOCUMENTS 3,440,449  4/1969  Priel et al. ........................... 307/291
3,654,493  4/1972  Kardash ........................... 307/291 X

OTHER PUBLICATIONS

Inabe et al., "An Integrated JK Flip-Flop Circuit"; pp. 403–406; 8/1977; *IEEE-JSSC*, vol. SC-12, No. 4.
D'Agostino et al., "High Speed Low Power Complementary J-K Flip-Flop"; *RCA Tech. Notes*; TN No.: 793; 9/25/1968, 2 sheets.
"Mikroelektronische Schaltkreise" by A. Moschwitzer and G. Jorke, VEB Verlag Technik, Berlin 1979, p. 121, Figure 2.41d.
Solid State Electronics, vol. 24, 1981, pp. 343–366, particularly Figure 1.

*Primary Examiner*—Stanley D. Miller
*Assistant Examiner*—D. R. Hudspeth
*Attorney, Agent, or Firm*—Hill, Van Santen, Steadman & Simpson

[57] ABSTRACT

An integrated JK-flipflop circuit comprises two cross-coupled inverters formed by a transistor and a resistor element connected in series therewith. Additional logic elements connect inputs of the flipflop to the cross-coupled inverters. It is a goal to provide the flipflop circuit on the smallest possible semiconductor area. This is achieved since the transistors of the inverters are designed as hot electron transistors, whereby each of these transistors is combined with one of the additional logic elements provided as a field effect transistor to form a common component which assumes two transistor functions but only requires the area of one field effect transistor.

13 Claims, 4 Drawing Figures

INTEGRATED JK-FLIPFLOP CIRCUIT INCLUDING HOT-ELECTRON TRANSISTORS

BACKGROUND OF THE INVENTION

The invention relates to an integrated JK-flipflop circuit formed of two cross-coupled inverters with each inverter comprising a transistor and a resistor element connected in series therewith. A first circuit node between the transistor and resistor element in one of the inverters is connected to a control terminal of the transistor and the other inverter. The circuit node is also connected via a further inverter to a gate of a first field effect transistor having its source-drain path connected between the other circuit node and a terminal at reference potential. The gate of this field effect transistor is connected to the reference terminal via an additional logic element whose control input represents a flipflop input.

A flipflop circuit of this type is known from the book "Mikroelektronische Schaltkreise" by A. Möschwitzer and G. Jorke, VEB Verlag Technik, Berlin 1979, page 121, FIG. 2.41d, incorporated herein by reference. The additional logic elements therein are provided as field effect transistors, whereby two of them have their source-drain segments connected parallel to the field effect transistors of the cross-coupled inverters.

SUMMARY OF THE INVENTION

An object of the invention is to specify an integrated JK-flipflop circuit which can be realized on a significantly smaller semiconductor area than can comparable, traditional circuits. This object is achieved wherein transistors of the cross-coupled inverters are hot electron transistors of a tunnel emission type having an emitter layer, insulator layer, a base layer, and a collector layer. Each hot electron transistor of the cross-coupled inverters is combined with a logic element of the further inverter which comprises a second field effect transistor. The emitter layer of the hot electron transistor is the inversion layer in the channel region of the field effect transistor. The base layer is a first part of the gate electrode of the field effect transistor, and the insulator layer is disposed between the base layer and a first part of the channel region of the field effect transistor. The collector layer having a portion laterally projecting over the base layer, represents the remaining part of the gate electrode which covers the remaining part of the channel region of the field effect transistor.

The advantage attainable with the invention is that two respective field effect transistors of the known JK-flipflop circuit are combined into a single semiconductor component which assumes two transistor functions and only requires the semiconductor area of a single MIS field effect transistor for its construction. The switching speed of the inventive flipflop is greatly improved in comparison to traditional circuits since the HET (Hot Electron Transistor) transistors present in the semiconductor components represent rapid switching elements and since the connecting lines between the transistors respectively combined into such components are eliminated.

DESCRIPTION OF THE PREFERRED EMBODIMENTS

Figure 1:
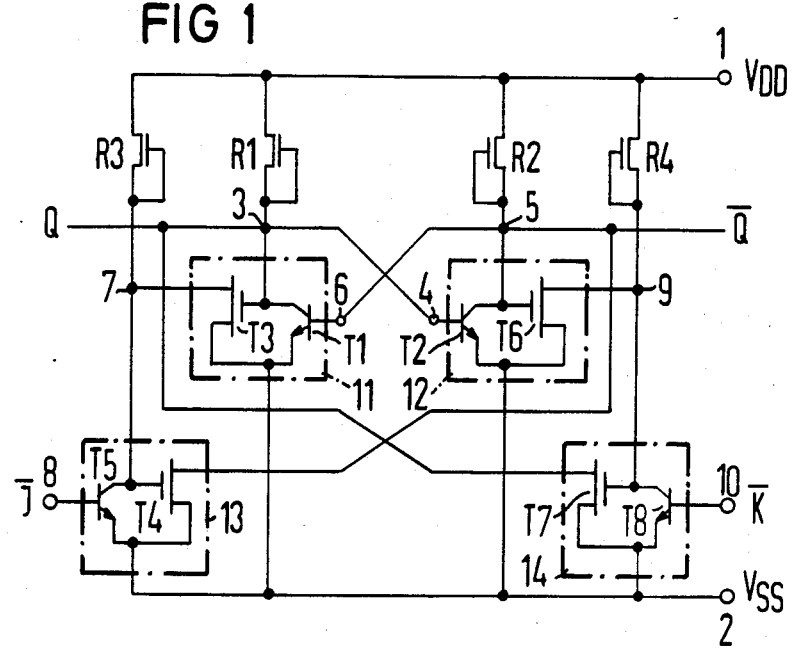
FIG. 1 shows an inventively designed JK-flipflop.

Two cross-coupled inverters which form a flipflop circuit are shown in FIG. 1. The first inverter consists of the series connection of a transistor T1 and a resistor element R1. The end-side terminals 1 and 2 of the series connection are respectively wired with the supply voltage $V_{DD}$ and the reference potential $V_{SS}$. The second inverter, which comprises a transistor T2 and a resistor element R2, likewise is at the terminals 1, 2. A circuit node 3 which is connected to the base terminal of T2 is situated between T1 and R1. A circuit node 5 that is connected to the base terminal 6 of T1 lies between T2 and R2. The resistor elements R1 and R2 which are shown as field effect transistors of the depletion type in FIG. 1 whose gate electrodes are connected to the source terminals can also be realized in some other manner, for example as field effect transistors of the enhancement type whose gate electrodes are connected to the drain terminals, as strip-shaped structures consisting of resistance-affected material, or the like. Simultaneously, the circuit nodes 3 and 5 represent the output Q and the inverted output $\overline{Q}$ of the flipflop circuit.

The series connection of a field effect transistor T3 and a resistor element R3 also lies at the terminals 1 and 2. The gate of T3 is connected to the circuit node 3. The junction 7 of T3 and R3 is connected to the gate of a field effect transistor T4 whose source-drain segment lies between the circuit points 2 and 5. Connected between the circuit points 7 and 2 is the collector-emitter path of a further transistor T5 whose base terminal 8 represents the control input J of the JK-flipflop. This means that the inverted J signal is always supplied to the terminal 8.

In an analogous fashion, a series connection of a field effect transistor T6 and a resistor element R4 also lies between the terminals 1 and 2, whereby the gate of T6 is connected to the circuit node 5, and the junction of T6 and R4 is connected to the gate of a field effect transistor T7 whose source-drain segment is connected to the circuit points 2 and 3. The collector-emitter path of a transistor T8 whose base terminal 10 forms the control input $\overline{K}$ of the flipflop, is inserted between the circuit points 9 and 2. This means that the inverted signal K is always supplied to the terminal 10.

The transistors T1, T2, T5 and T8 are realized as hot electron transistors of the tunnel emission type. Transistors of this type are known, for example, from Solid State Electronics, Vol. 24, 1981, pages 343–366, particularly FIG. 1, incorporated herein by reference. According to the invention, each of these hot electron transistors is combined with a field effect transistor of the flipflop circuit to form a common component, namely T1 and T3 to form a component 11, T2 and T6 to form a component 12, T5 and T4 to form a component 13, and T8 and T7 to form a component 14.

Figure 2:
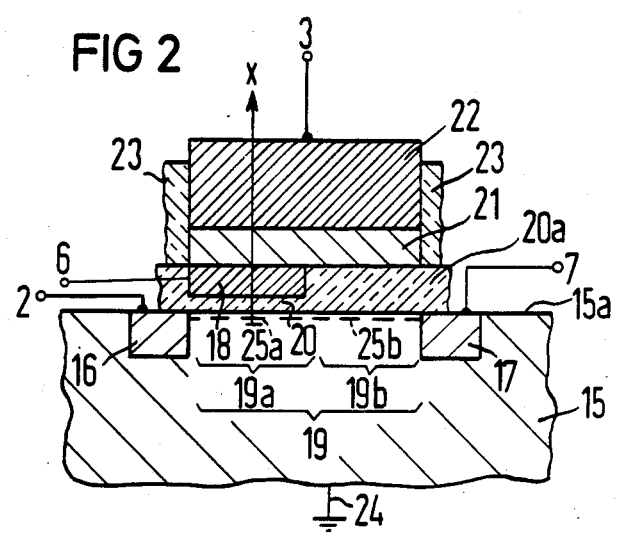
FIG. 2 illustrates the cross-section of a component shown in FIG. 1 which comprises an MIS field effect transistor and a hot electron transistor.

These components, which are identically designed, shall be described in greater detail below with reference to component 11. FIG. 2 shows a cross-section through this component.

The component is disposed on a body 15 consisting of doped semiconductor material, for example p-doped silicon having an impurity concentration of about $10^{15}/cm^3$. Into these two regions n+ doped regions 16 and 17 which proceed from a boundary surface 15a are inserted. They represent the source region and the drain region of the field effect transistor T3 whose gate electrode consists of two parts. The first part is formed by a metallic or a metallically conductive layer 18 which covers that part 19a of the channel region 19 lying between 16 and 17 which is adjacent to the region 16. A very thin insulator layer 20 lies between the layer 18 and the boundary surface 15a. The thickness of the insulator layer 20 which, for example, consists of $SiO_2$ or $Si_3N_4$, expediently amounts to about 2 to 5 nm. The layer 18 advantageously consists of an hmp metal, for example Ta, Ti, Mo, or W, or of the silicide of one of these metals, i.e. $TaSi_2$, $TiSi_2$, $MoSi_2$ or $WSi_2$, and can have a thickness of about 10 nm. Situated above the layer 18 is a polycrystalline silicon layer 21 having a thickness of about 10 to 100 nm and preferably having a p-doping which is given, for instance, by a doping concentration of $10^{14}$ to $10^{15}/cm^3$, whereby boron can be employed as the dopant. Situated on the layer 21 is a metallic or metallically conductive layer 22 whose thickness can be arbitrarily selected but which is preferably thicker than the layer thickness of 21. The layer 22 advantageously consists of one of the metals or silicides that have already been cited in conjunction with the layer 18. The layers 21 and 22 cover the entire channel region 19, whereby that part of 22 which laterally projects beyond the layer 18 covers the second part 19b of the channel region 19. A layer (field oxide layer) which is electrically insulating covers the surface 15a outside of the parts 16, 17 and 19 comprises parts 23 which are laterally adjacent to the layers 18, 21, and 22.

The source region 16 is connected to the terminal 2. The drain region 17 is connected to the circuit point 7. The semiconductor body 15 is connected with the reference potential at 24. Furthermore, the base layer 18 is connected to the terminal 6, whereas the layer 22 is connected with the circuit node 3.

When a voltage that lies above a value referred to as first threshold voltage is supplied via the terminal 6 to that part of the gate electrode of the field effect transistor T1 which consists of the layer 18, then a depletion zone which proceeds from the boundary surface 15a is formed in the semiconductor body 15 under 18, whereby an inversion layer 25a which forms an n-conductive channel under 18 is built up within the depletion zone directly at the boundary surface 15a. The inversion layer 25a represents the emitter layer of a hot electron transistor (HET) of the tunnel emission type which additionally comprises the layers 20, 18, 21 and 22. The layer 18 thus forms a metallic or metallically conductive base layer of the HET. The insulator layer 20 is situated between the layer 18 and the emitter layer 25a, and the polycrystalline silicon layer 21 represents the collector layer of the HET together with the metallic or metallically conductive layer 22. A collector voltage which consists of the voltage at the circuit node 3 in FIG. 1 is supplied to the layer 22 via the terminal 3. When this voltage exceeds a second threshold voltage which is allocated to the part 19b of the channel region 19, then an inversion layer 25b is formed under that part of the layer 22 which laterally projects over the layer 18, said inversion layer 25b forming an n-conductive channel between the regions 16 and 17 together with the inversion layer 25a. The fact that a part 20a of the insulator layer 20 having a thickness of 15 nm is significantly thicker than the remaining parts of this layer, and is situated between the second part of the gate electrode formed by the layer 22 and the part 19b of the channel region 19, is a co-determining factor for the result that the second threshold voltage is higher than the first.

Let the function of the HET be explained below with reference to the energetic band structure diagram shown in FIG. 3. This shows energy states E provided in the direction of the vertical axis which appear as a function of various distances x from the inversion layer or emitter layer 25a. These distances are provided on the x-axis which penetrates the layers of the HET in a vertical direction in FIG. 2, i.e. perpendicular to the boundary surface 15a. Successive segments of the x-axis are allocated to the layers 25a, 20, 18, 21 and 22, whereby the lengths d25a, d20, d18, d21 and d22 of these segments differ from the actual layer thicknesses D25a, D20, D18, D21 and D22 of the layers 25a, 20, 18, 21 and 22 for the sake of a clear illustration. Thus, for example, the segment d20 is greatly elongated in comparison to the segments d25a, d18, d21 and d22. The upper limit of the valency band of the semiconductor material of 15 is referenced $E_{v1}$ in the segment d25a allocated to the inversion layer 25a, whereas $E_{c1}$ represents the energy level of the electrons within the inversion layer 25a. In segment d20, the upper line $E_{c20}$ represents the lower limitation of the conduction band of the insulator layer 20, whereas the lower line $E_{v20}$ denotes the upper limit of the valency band. The respective Fermi levels $E_{F18}$ and $E_{F22}$ are provided in the segments d18 and d22, whereas the lower limit of the conduction band of the layer 21 is shown by means of $E_{c21}$ in the segment d21 and the upper limit of the valency band is shown therein by means of $E_{v21}$.

Figure 3:
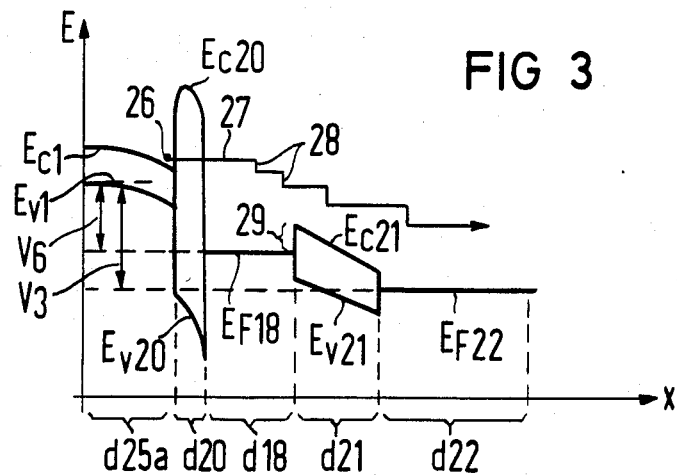
FIG. 3 shows a band structure diagram for explaining FIG. 2.

Given a sufficiently low thickness D20 of the insulator layer 20, electrons proceed from the inversion layer 25a—these being identified in FIG. 3 according to their energy level, for example by means of the point 26, and proceed through the insulator layer 20 into the base layer 18 as a consequence of the tunnel effect, as indicated by means of the horizontal straight-line. They lose energy due to scatter at voids and at the crystal lattice of the layer 18, this being expressed by the step-shaped curve 28. Then the energy of these electrons is subsequently high enough so that they can overcome the energy threshold 29 at the boundary surface between the layers 18 and 21, and they proceed into the collector layer of the HET, the collector layer consisting of the layers 21 and 22. The magnitudes of the voltages applied via the terminals 6 and 3 relative to the reference potential are referenced $V_6$ and $V_3$ in FIG. 3.

When the JK-flipflop is situated in its reset condition (T1 conductive, T2 inhibited), then a voltage which corresponds to a logical "1" and which roughly corresponds to the supply voltage $V_{DD}$ can be tapped at the output OVs/Q/ . The output Q lies at about reference potential $V_{SS}$, this corresponding to a logical "0". As a consequence of the low potential at 3, the second threshold voltage of T3 is crossed downwardly so that the inversion layer 25b of this transistor cannot form and its regions 16 and 17 do not have a conductive connection. T3 therefore inhibits, even though its inversion layer 25a is present because of the "1" at $\overline{Q}$, and thus at the base layer 18 of T1. On the other hand, T6 is conductive because of the "1" at the output $\overline{Q}$ with which the first and the second threshold voltage of T6 is exceeded, even though a "0" is supplied to the base layer of T2 via the terminal 4.

Despite the inhibited transistor T3, the circuit point 7 is at roughly the reference potential $V_{SS}$ because T5 is conductive in the initial condition of the circuit in which the input 8 is occupied with a logical "1". On the other hand, the circuit point 9 is applied to roughly the reference potential $V_{SS}$ both via the conductive transistor T6 as well as via the conductive transistor T8 to which a logical "1" is likewise continuously supplied via 10 in the initial condition of the circuit. The transistors T4 and T7 are therefore inhibited so that no influence on the switch status of the flipflop can occur via them. The inversion layers 25a of T4 and T7 are respectively present in the components 13 and 14, whereas their inversion layers 25b are lacking.

When a logical "1" is briefly supplied as a J signal—this denoting a brief switchover at the inverting input 8 from the continuously pending "1" to a "0"—, then T5 is inhibited for the brief duration of the switchover, the potential of the circuit point 7 is boosted to about $V_{DD}$, T4 is switched into its conductive condition due to the formation of the inversion layer 25b, and $\bar{Q}$ is drawn down via T4 to the potential $V_{SS}$. This reduction in potential is felt at the terminal 6, and inhibits T1. The voltage at the output Q thus rises to a "1", so that T2 becomes conductive. The flipflop has been switched into its set condition (T1 inhibits, T2 conductive). As a consequence of the conductive transistors T3 and T5, 7 is at reference potential $V_{SS}$, whereas 9 is held at $V_{SS}$ due to the conductive transistor T8 despite the inhibited transistor T6. The potentials at 7 and 9 thus inhibit T4 and T7 so that further influence on the flipflop circuit is suppressed.

Only given supply of a brief K signal, i.e. given a brief switchover at the terminal 10 from the continuously adjacent "1" to a "0", is T8 inhibited. Also, the potential at 9 is boosted to about the value $V_{DD}$, T7 is switched on, and via T7, the output Q is again applied to $V_{SS}$ or "0", this effecting a switching of T2 into its non-conductive condition via the cross-coupling of the inverters T1, R1 and T2, R2. The flipflop has thus switched back into its reset condition.

When finally J and K signals are briefly supplied to the circuit at the same time, this leads to a simultaneous, brief switchover from the continuously pending "1" signals to "0" signals at 8 and 10. Then the flipflop is switched from its set condition into its reset condition or vice versa given each such switchover. A sequence of "1" signals having half the repetition rate of the signals at 8 or 10 can thus be tapped at the output Q.

Figure 4:
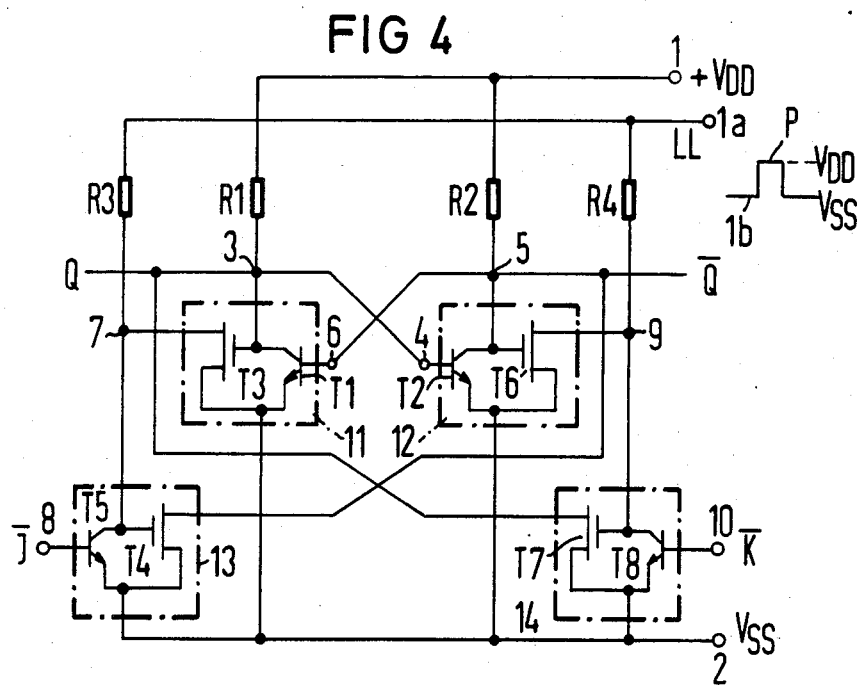
FIG. 4 is a further inventively designed JK-flipflop.

FIG. 4 shows a second embodiment of a clocked JK-flipflop designed in accordance with the invention. This differs from FIG. 1 since only the two series connections T1, R1 and T2, R2 are connected to the terminals 1 and 2. Differing from FIG. 1, the series connections T3, R3 and T6, R4 are connected to a terminal 1a which is connected with a clock signal 1b. The clock signal alternates between the values $V_{SS}$ and $V_{DD}$, whereby the latter value is only reached during the appearance of the short-duration clock pulses P. When the flipflop circuit of FIG. 4 is in its reset condition (Q=0), then a "0" supplied to the input 8 and corresponding to the signal J=1 causes a changeover to the set condition upon the appearance of the next successive clock pulse P. When this set condition is present, then a "0" supplied to the input 10 corresponding to a signal K=1, in turn causes a changeover into the reset condition at the appearance of the next respective clock pulse P. When a respective "1" is adjacent to both inputs 8 and 10, then the switch condition of the flipflop is changed at the appearance of every clock pulse P. A pulse sequence having half the repetition rate of the clock pulses P can thus be tapped at one of the outputs, for example Q.

The manufacture of the semiconductor component according to FIG. 2 initially corresponds to the traditional manufacture of a field effect transistor. After a field oxide layer 23 which covers the semiconductor body 15 in surface-wide fashion has been etched off above the channel region 19 and above the regions 16 and 17, and after an insulator layer having a thickness of, for example, 15 nm (roughly corresponding to the thickness of the part 20a in FIG. 2) has been grown in the etched region, an intermediate mask is applied to the insulator layer 20a. This intermediate mask leaves only the region of the metallically conductive layer 15 free with its opening. The insulator layer is etched off to a thickness of about 2 to 5 nm in this region, for example by means of an etching agent on a fluorine/hydrogen basis. This is indicated in FIG. 2 by means of the reduced thickness of the layer 20 above 19a. The layer 18 is then applied by use of the same intermediate mask. After removal of the intermediate mask, a further mask which has an opening that defines the lateral dimensions of the layers 21 and 22 is applied. The layers 21 and 22 are then successively applied by use of this mask. The layer 21 is thus provided with a p-doping whose concentration amounts to $10^{14}$ through $10^{15}/cm^3$ before the layer 22 is applied. The removal of the mask is followed by an implantation of a dopant in order to generate the regions 16 and 17, whereby the layers 18, 21 and 22 as well as the field oxide layer serve as parts of a doping mask (self-adjustment). After the application of leads to the circuit points 2 and 7, and which contact the parts 16 and 17 through contact holes in the insulator layer 20a, the parts of the field oxide layer that were previously etched away above the regions 16 and 17 are built up again to such degree that the field oxide layers extend up to the lateral limiting surfaces of the layers 18, 21 and 22, as indicated in FIG. 2 by the parts 23. A lead which contacts the layer 22 and leads to the terminal 3 is subsequently laid.

According to another preferred embodiment of the invention, the semiconductor component 11, 12, 13 or 14 is built up on a body 15 consisting of a p-doped III–V semiconductor compound such as, for example, GaAs having a doping concentration of, for example, $10^{16}/cm^3$. The insulator layer 20 preferably consists of AlGaAs. The polycrystalline silicon layer 21 is replaced by a layer of p-doped GaAs with Be as the dopant, whereas the layer 18 is preferably formed of a highly doped, n-conductive III–V semiconductor compound, for example GaAs, with Si as dopant. This behaves similar to a metal with respect to its electrical conductivity given a doping concentration of about $10^{18}/cm^3$. The layer 22 also advantageously consists of the same material as the layer 18.

Given a further embodiment of the invention, the semiconductor component 11, 12, 13 or 15 is designed such that the previously described layer 21 is replaced by a second insulator layer which corresponds to the insulator layer 20 in terms of its structure and thickness. When a semiconductor body 15 of p-doped silicon is provided, the second insulator layer consists of $SiO_2$ or $Si_3N_4$. It consists of AlGaAs given a semiconductor body consisting of GaAs. Its thickness preferably amounts to about 2 to 5 nm.

Although various minor changes and modifications might be proposed by those skilled in the art, it will be understood that we wish to include within the claims of the patent warranted hereon all such changes and modifications as reasonably come within our contribution to the art.

We claim as our invention:

1. An integrated JK-flip-flop, comprising:
   first and second cross-coupled inverters formed of respective first and second transistors and respective first and second resistor elements connected in series with the respective first or second transistors;
   a first circuit node between the first transistor and first resistor element being connected to a control terminal of the second transistor, and a second circuit node between the second transistor and second resistor element being connected to a control terminal of the first transistor;
   said first circuit node being connected via a third inverter to a gate of a first field effect transistor which has its source-drain path connected between said second circuit node and a terminal at reference potential, and said second circuit node being connected via a fourth inverter to a gate of a second field effect transistor which has its source-drain path connected between said first circuit node and the reference terminal;
   a gate of the first field effect transistor being connected to the reference terminal via a first control element whose control input represents a first input of the flip-flop, and a gate of the second field effect transistor being connected to the reference terminal via a second control element whose control input represents a second input of the flip-flop;
   the first and second transistors of the first and second cross-coupled inverters each comprising a hot electron transistor (HET) of a tunnel emission type having an emitter layer, insulator layer, base layer, and collector layer;
   the third and fourth inverters comprising respective third and fourth field effect transistors;
   each HET being combined with the respective third or fourth field effect transistor such that the HET emitter layer comprises an inversion layer in a channel region of the respective field effect transistor, the base layer of the HET being a first part of a gate electrode of the respective field effect transistor, an insulating layer between the HET base layer and a first part of said channel region, and the collector layer of the HET which has a portion over the HET base layer representing a remaining portion of the gate electrode of the respective field effect transistor and which covers a remaining second part of the channel region.

2. An integrated JK-flipflop circuit according to claim 1 wherein said first and second control elements comprise HETs which are combined with the respective first or second field effect transistors such that an emitter layer of the HET is an inversion layer in the channel region of the respective field effect transistor, the base layer is a first part of a gate electrode of the field effect transistor, the insulator layer is positioned between the base layer and a first part of the channel region, and the collector layer covers a remaining second part of the channel region with a portion laterally projecting over the base layer.

3. An integrated JK-flipflop circuit according to claim 1 wherein the third and fourth inverters are connected between a first terminal connected with a clock signal and the reference terminal whereas the cross-coupled first and second inverters are connected between a third terminal connected with the supply voltage and the reference potential terminal.

4. An integrated JK-flipflop circuit according to claim 1 wherein the base layer comprises an hmp metal selected from the group consisting of Ta, Ti, Mo, W, or a silicide of such metals.

5. An integrated JK-flipflop circuit according to claim 1 wherein the base layer comprises a highly doped III-V semiconductor compound provided with an n-doping.

6. An integrated JK-flipflop circuit according to claim 1 wherein the collector layer comprises a metallically conductive layer and a polycrystalline p-doped silicon layer situated between said metallic layer and the base layer.

7. An integrated JK-flipflop according to claim 1 wherein the collector layer comprises a metallically conductive layer and an intermediate layer situated between said conductive layer and the base layer, said intermediate layer comprising a III-V semiconductor compound preferably provided with a p-doping.

8. An integrated JK-flipflop circuit according to claim 1 wherein the collector layer comprises a metallically conductive layer and a second insulator layer situated between said conductive layer and the base layer.

9. An integrated JK-flipflop circuit according to claim 6 wherein the metallically conductive layer forming one part of the collector layer comprises an hmp metal selected from the group consisting of Ta, Ti, Mo, W, or a silicide of these metals.

10. An integrated JK-flipflop circuit according to claim 6 wherein the metallically conductive layer forming one part of the collector layer comprises a highly doped III-V semiconductor compound which is provided with an n-doping.

11. An integrated JK-flipflop circuit according to claim 1 wherein a thickness of the insulator layer situated between the base layer and the channel region is in a range from 2 to 5 nm.

12. An integrated JK-flipflop according to claim 1 wherein the hot electron transistor comprises a second insulator layer between a metallic layer and a base layer, said second insulator layer having a thickness in a range from 2 to 5 nm.

13. An integrated JF-flip-flop comprising:
   first and second cross-coupled inverters each formed of a resistive element connecting in series, at respective first and second nodes, with a hot electron transistor (HET);
   third and fourth inverters each formed of a resistive element connecting in series, at respective third and fourth nodes, with a field effect transistor (FET);
   first and second circuit means, responsive and controlled by first and second flip-flop control signals respectively, and each being connected to and controlling the third and second and fourth and first nodes, respectively;
   the HETs of the first and second inverters being combined in a single semiconductor structure with the FETs of the respective third and fourth inverters and wherein the HETs are of a tunnel emission type having an emitter layer, insulator layer, base layer, and collector layer; and the HET emitter layer comprising and inversion layer in the corresponding FET channel region, the HET base layer being a metallic layer separated by the insulating layer from a portion of the channel region, and the collector layer comprising a metallic layer extending over substantially the entire channel region and also functioning as a gate of the FET.

* * * * *